United States Patent [19]

Suzuki

[11] 3,916,343

[45] Oct. 28, 1975

[54] FREQUENCY STABILIZED RELAXATION OSCILLATOR

[75] Inventor: Takeshi Suzuki, Okazaki, Japan

[73] Assignee: Minolta Camera Kabushiki Kaisha, Japan

[22] Filed: July 31, 1974

[21] Appl. No.: 493,465

[30] Foreign Application Priority Data

Aug. 1, 1973 Japan .............................. 48-91428

[52] U.S. Cl. .............. 331/111; 307/252 F; 331/175

[51] Int. Cl.$^2$ ...................... H03K 1/02; H03K 3/35

[58] Field of Search ........... 331/111, 175, 109, 176; 307/252 F, 283

[56] References Cited

UNITED STATES PATENTS 3,660,686 5/1972 Muskovac ...................... 331/111 X 3,794,857 2/1974 Milovancevic ............. 307/252 F X

*Primary Examiner*—Siegfried H. Grimm
*Attorney, Agent, or Firm*—Craig & Antonelli

[57] ABSTRACT

An improved relaxation oscillator circuit comprises a switching device such as a programmable unijunction transistor and a time-constant circuit. A voltage dividing network consisting of two or more resistors and a diode connected together in series is employed to apply a constant bias voltage to the gate of the transistor or to the control electrode of the switching device. The diode inserted in the voltage dividing network serves to compensate for a voltage change of the source and to apply a constant bias voltage to the gate, hence to maintain the oscillation frequency constant, even for very low source voltage.

9 Claims, 5 Drawing Figures

FREQUENCY STABILIZED RELAXATION OSCILLATOR

BACKGROUND OF THE INVENTION

1. Field of the Invention

This invention relates to an improvement in a relaxation oscillator.

More particularly, this invention is directed to a relaxation oscillator which is capable of oscillating with a highly stable frequency.

2. Description of the Prior Art

In FIG. 1 and FIG. 2 are shown examples of conventional relaxation oscillators comprising programmable unijunction transistors (hereinafter referred to as PUT) as switching elements. As is well known, a PUT has a characteristic that it becomes conductive, i.e., turn ON, once the potential at its anode A is higher than the potential of its gate G by a certain voltage which is generally about 0.6 volts. In the prior art examples, the gate of the PUT Q1 is applied with a substantially constant voltage produced by a voltage dividing network consisting of resistors R3 and R4 connected across a source + VB. A capacitor C1 and a variable resistor R1 together constitute a time-constant circuit, which applies the voltage across the capacitor C1 to the anode A of the PUT Q1 when charged. When the voltage across the capacitor C1, namely, the potential at the anode becomes higher than the potential of the gate by 0.6 volts, the PUT Q1 becomes conductive and the electric charge on the capacitor C1 is discharged through the PUT Q1 in a very short time. When the discharge is completed, the PUT Q1 is restored to the OFF state, and the capacitor C1 begins to charge up. Thus, a relaxation oscillation is provided.

The frequency of the relaxation oscillation is varied by changing the value of the resistor R1 or the capacitor C1.

A resistor R2 of high-resistance and a diode D1 connected across both ends of the resistor R2 are connected between the dividing point *a'* and the gate G of the PUT Q1. The circuit of the resistor R2 and the diode D1 serves the purpose, for the period while the PUT is OFF, to restrict the current from the anode to the gate of the PUT Q1 and, for the period while the PUT is ON, to allow a necessary gate current through the resistor R3 and through the diode D1.

The higher the value of resistor R2 the smaller becomes the leakage current flowing through the resistor R1, through the anode A and gate G of the PUT Q1 and the resistors R2 and R4 enabling the selection of resistance of the resistor to be very high, and hence, considerably widening the frequency variation range.

A second prior art example is shown in FIG. 2, wherein the circuit is similar to that of FIG. 1, but a resistor R6 and a transistor Q2 are provided, while the diode is omitted. In this circuit, the resistance values of the resistors R3 and R4 can be selected to be considerably higher than those of the circuit of FIG. 1, so that power consumption by these resistors can be lowered. When the transistor Q2 is ON, the gate current of the PUT Q1 flows through the resistor R6 and the collector and emitter of the transistor Q2, and very small current flows through the resistor R3 to the base of the transistor Q2. Accordingly, the resistance values of the resistors R3 and R4 can be made high as mentioned above.

When the voltage of the power source decreases in the above-mentioned prior-art circuits of FIG. 1 and FIG. 2, then the gate bias voltage of the PUT Q1 decreases also and consequently, the anode voltage to turn the PUT Q1 on is also lowered.

When the resistances R3 and R4 of the resistors R3 and R4 are selected to satisfy the relation $$\frac{R3}{R3 + R4} = K,$$

and when the voltage of the power source applied to the terminal +VB is $V0$, then the gate voltage of the PUT Q1 is $KV0$. When the source voltage $V0$ is decreased to $nV0$ (where $0 < n < 1$), for instance, due to the loss of energy of a source battery, the gate voltage becomes $n.\ K.\ V0$.

On the other hand, the voltage of the anode A is as follows. Generally, the charged voltage $V$ in the capacitor C1 is represented by the equation:

$$V = V0\ (1 - e^{-t/R1\ C1}) \qquad (1)$$

wherein $V0$ is source voltage, $t$ is charging time, and R1 and C1 are resistance and capacitance of the resistor R1 and the capacitor C1, respectively.

Accordingly, for $t1$ being the time during which capacitor C1 is charged up to the voltage $KV0$, the following equation holds:

$$KV0 = V0\ (1 - e^{-t1/R1C1}) \qquad (2)$$

Further, when the source voltage decreases to $nV0$, another charged voltage $Vn$ is obtained at the time $t1$ as represented by the equation:

$$Vn = n\ .\ V0\ (1 - e^{-t1/R1\ C1}) = n\ .\ K.V0 \qquad (3)$$

Considering the foregoing three equations (1) to (3) for anode voltage together with the afore-mentioned gate voltages, under the hypothetical condition that the PUT Q1 is ON for equal potentials at the anode A and the gate G, the charging period, hence oscillation frequency in this relaxation oscillator, does not vary even, if the source voltage should change. However, in fact, the PUT Q1 is turned ON for an anode potential which is higher than a gate potential by a specified potential difference of about 0.6 volt. This potential difference does not vary even if the anode-cathode voltage or gate-cathode voltage changes. Accordingly, when the relaxation oscillator of the prior art circuits of FIG. 1 or FIG. 2 is operated with such a low source voltage that the above-mentioned potential difference cannot be neglected for the divided voltage $KV0$, the charging period hence, the oscillation frequency, undesirably changes for a change of the voltage of the power source.

SUMMARY OF THE INVENTION

This invention is directed to a relaxation oscillator which is capable of oscillating with a constant frequency, regardless of a change in its source voltage.

In order to maintain the oscillation frequency constant regardless of a change in the source voltage in a relaxation oscillator comprising a PUT, it is necessary to obtain an anode potential higher than a gate potential by a specified voltate difference $\alpha$, which is generally 0.6 volt, regardless of a change of source voltage.

In the present invention, in order to obtain the above-mentioned voltage difference $\alpha$, the forward voltage-current characteristic of a diode is utilized as explained hereinafter.

DETAILED DESCRIPTION

Figure 1:
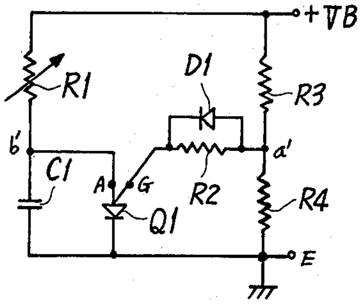
FIG.1. (PRIOR ART)
FIG. 1 and FIG. 2 are circuit diagrams of examples of relaxation oscillators of the prior art.
Figure 2:
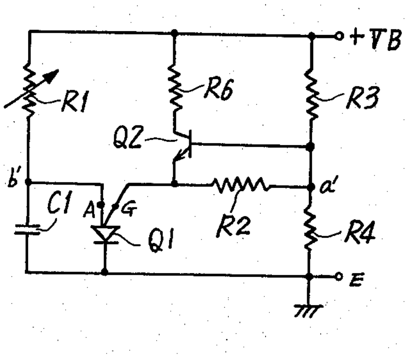
FIG.2. (PRIOR ART)
Figures 3, 4:
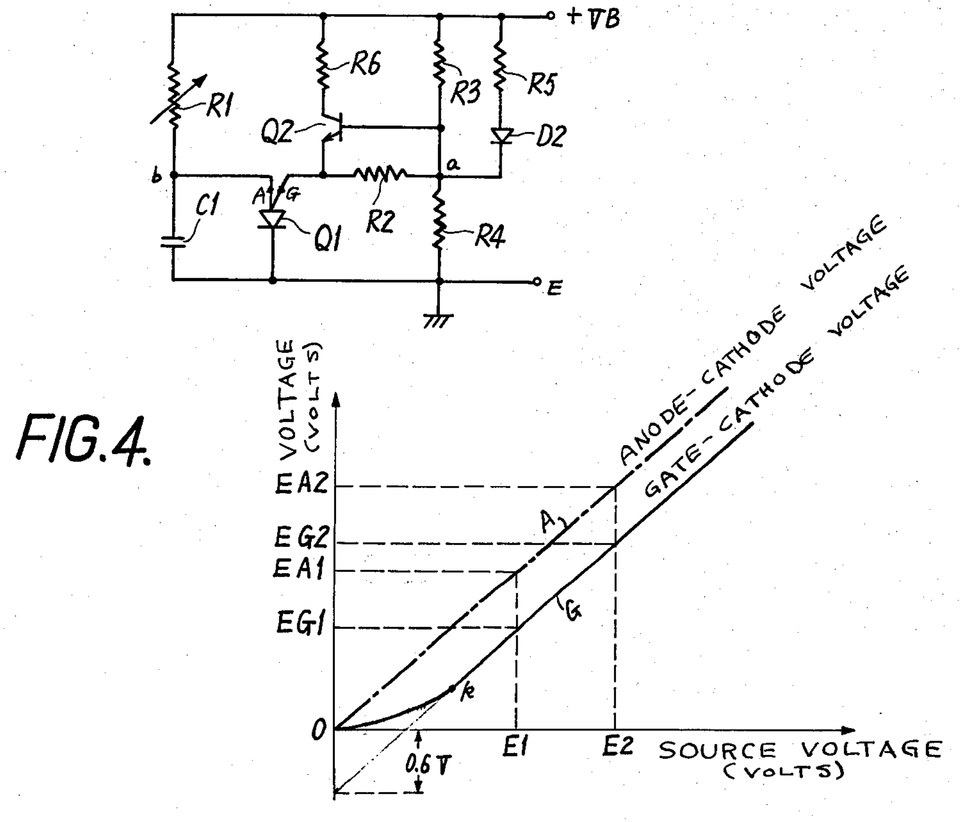
FIG. 3 and FIG. 5 are circuit diagrams of examples of relaxation oscillators of the present invention.
FIG. 4 is a diagram for explaining operation of the present invention.

FIG. 3 shows a first example of the present invention, wherein a timer circuit consisting of a resistor R1 of resistance R1 and a capacitor C1 of capacitance C1 is connected between a positive source terminal +VB and a negative source terminal E. A junction point *b* between the resistor R1 and the capacitor C1 is connected to the anode A of the PUT Q1. A voltage dividing circuit consisting of a resistor R3 of resistance R3, resistor R4 of resistance R4, another resistor R5 and a diode D2 is also connected across said positive terminal +VB and the negative source terminal E. The junction point *a* of the resistors R3 and R4 and the diode D2 is connected to the gate G of the PUT Q1 through the resistor R2. The base of a bipolar type transistor Q2 is connected to the junction *a*, and the emitter of the transistor Q2 is connected to the gate G of the PUT Q1. The collector of the transistor Q2 is connected to the positive source terminal + VB through the resistor R6.

Upon conduction of the programmable unijunction transistor Q1 the potential of its gate G becomes low, resulting in an increase in the base-emitter voltage of the bi-polar transistor Q2, hence turning the transistor Q2 ON. Consequently, a considerable current flows in the path of terminal + VB — resistor R6 — transistor Q2 — gate G of PUT Q1 making the anode-cathode path of the programmable unijunction transistor Q1 high conductive even if the resistors R3 and R4 are of high resistance in order to minimize current flowing from the power source into these resistors R3 and R4.

The resistor R5 and the diode D2, connected in series together, are connected across both ends of the resistor R3.

In FIG. 4, curve A shows the relation between the source voltage VB and the anode-cathode voltage for the PUT Q1 when the PUT Q1 turns on for a relaxation oscillation at a predetermined frequency.

Curve G shows the relation between the source voltage VB and gate-cathode voltage of the PUT Q1 when the PUT Q1 turns on for a relaxation oscillation at the predetermined frequency.

The forward directed diode D2 is regarded as a constant-voltage element having a constant voltage of less than 1 volt in the forward direction. To explain further, the forward voltage between the terminals of the diode is proportional to the logarithm of the current flowing therethrough. Therefore, even in such a wide change of current as 50%, the voltage across both terminals of the diode changes only about 3%. Therefore, by selecting the resistance values of the resistors R3, R4, and R5 appropriately, a desired characteristic of the gate-cathode voltage namely, voltages lower than the anode-cathode voltages by 0.6 volt, is obtainable as shown by curve G of FIG. 4, except in a small range region between the points *o* and *k* on the G curve.

In one actual example of the relaxation oscillator of FIG. 3, the resistors R3, R4 and R5 are all 33KΩ, the initial source voltage across the terminals +VB and E is 3 volts, and the forward voltage across both terminals of the diode D2 is 0.6 volts. Incidentally, the resistance R2 is selected to be of a value such as 1 meg Ω. The above-mentioned relaxation oscillator effects a stable relaxation oscillation at a substantially constant frequency until the source voltage decreases to 1.8 volts. The resistor R3 is for moderating the effect of the constant voltage drop by the diode D2, in case the drop voltage exceeds the above-mentioned specified value $\alpha$ of the PUT. The smaller the R3 value is, the milder is the effect of the voltage drop by the diode D2.

Figure 5:
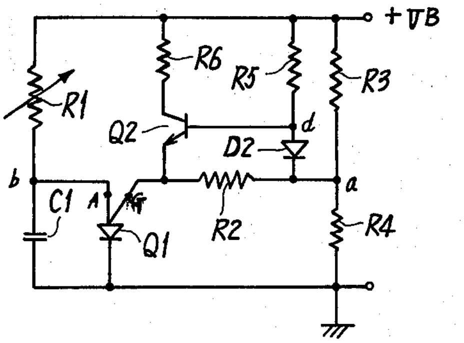

FIG. 5 shows another example of the invention, wherein the base of the transistor Q2 is connected to the junction point d between the resistor R5 and the diode D2. Other parts are similar to the example of FIG. 3. In this second example of FIG. 5, since the base of the transistor Q2 is connected to the junction point d between the resistor R5 and the diode D2, the base potential of transistor Q2 is retained higher than its emitter potential by the substantially constant forward voltage drop, for instance, 0.6 volts, even when the source voltage is decreased as low as 50% of the initial voltage. As a consequence of the above-mentioned connection, the base-emitter voltage of the transistor Q2 is retained constant and the gate current of the PUT Q1 is appropriate, and consequently, in comparison with the circuit of FIG. 3, a more stable oscillation at low source voltage is obtainable even when the resistor R1 is adjusted to be very low in order to obtain high frequency oscillation. Thus, by constituting the relaxation circuit as shown in FIG. 5, a stable relaxation oscillation is obtainable for a wide range of source voltage as from 1 volt to 9 volts.

I claim:

1. In a relaxation oscillator comprising:
a switching device:
a time-constant circuit connected to said switching device for applying a time-dependent voltage thereto; and
a bias circuit, coupled to said switching device, for applying a bias voltage thereto;
the improvement wherein
said bias circuit comprises a plurality of voltage dividing resistors and a forward directed diode connected together in series,
said switching device is a programmable unijunction transistor,
said time-constant circuit comprises a resistor and a capacitor, connected together in series across both terminals of power source, a first junction point therebetween being connected to the anode of the programmable unijunction transistor,
said bias circuit being so constituted that
a first resistor, a diode and a second resistor are connected in series together between the power source terminals;
a second junction point between the diode and said second resistor is connected through a third resistor, to the gate of the programmable unijunction transistor, and
a fourth resistor is connected between one of the power source terminals and the second junction point, and
a P-N junction element is connected with its P-N junction between the gate of the programmable unijunction transistor and the second junction point.

2. The improvement according to claim 1, wherein the P-N junction element is a bi-polar transistor connected with its collector through a fifth resistor to the power source, with its emitter to the gate of the programmable unijunction transistor and with its base to the second junction point.

3. The improvement according to claim 2, wherein the base of the transistor is connected to the second junction point through said diode.

4. The improvement according to claim 1, wherein the cathode of the programmable unijunction transistor is connected to the other of the power source terminals.

5. In a relaxation oscillator comprising:

a switching device, which has a first electrode, a second electrode, and a third electrode and once the potential at the first electrode is higher than the potential of the second electrode by a specified voltage, the path from the first electrode to third electrode and the path from the second electrode to the third electrode become conductive;

a time-constant circuit connected to said switching device for applying a time-dependent voltage thereto; and a bias circuit, coupled to said switching device for applying a bias voltage thereto;

the improvement wherein said bias circuit comprises a plurality of voltage dividing resistors and a forward directed diode connected together in series, said time-constant circuit comprises a resistor and a capacitor, connected together in series across both terminals of a power source, a first junction point therebetween being connected to the first electrode of the switching device, said bias circuit being so constituted that a first resistor, a diode and a second resistor are connected in series together between the power source terminals;

a second junction point between the diode and said second resistor is connected through a third resistor, to the second electrode of the switching device, and a fourth resistor is connected between one of the power source terminals and the second junction point, and a P-N junction element is connected with its P-N junction between the second electrode of the switching device and the second junction point.

6. The improvement according to claim 5, wherein the P-N junction element is a bi-polar transistor connected with its collector through a fifth resistor to the power source, with its emitter to the second electrode of the switching device and with its base to the second junction point.

7. The improvement according to claim 6, wherein the base of the transistor is connected to the second junction point through said diode.

8. The improvement according to claim 5, wherein the third electrode of the switching device is connected to the other of the power source terminal.

9. The improvement according to claim 8, wherein the switching device is a programmable unijunction transistor with the first electrode being the anode, the second electrode being the gate and the third electrode being the cathode of the programmable unijunction transistor.

* * * * *